US006897737B2

(12) United States Patent
Sakata et al.

(10) Patent No.: US 6,897,737 B2
(45) **Date of Patent: *May 24, 2005**

(54) VIBRATING REED, VIBRATOR, OSCILLATOR, AND ELECTRONIC DEVICE

(75) Inventors: Junichiro Sakata, Suwa (JP); Fumitaka Kitamura, Suwa (JP); Hideo Tanaya, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/672,597

(22) Filed: Sep. 26, 2003

(65) Prior Publication Data

US 2004/0056727 A1 Mar. 25, 2004

Related U.S. Application Data

(62) Division of application No. 10/087,606, filed on Mar. 1, 2002, now Pat. No. 6,724,271.

(30) Foreign Application Priority Data

Mar. 2, 2001 (JP) ...................................... 2001-059046

(51) Int. Cl.[7] ................................................ H03B 5/30
(52) U.S. Cl. ........................ 331/156; 310/361; 310/370
(58) Field of Search ................................ 331/156, 154; 310/328, 329, 361, 345, 351, 353, 370

(56) References Cited

U.S. PATENT DOCUMENTS

| | | | | |
|---|---|---|---|---|
| 4,384,232 A | | 5/1983 | Debely | 310/370 |
| 4,450,378 A | | 5/1984 | Hermann et al. | 310/361 |
| 4,592,663 A | * | 6/1986 | EerNisse et al. | 374/117 |
| 4,721,925 A | * | 1/1988 | Farace et al. | 331/154 |
| 4,724,351 A | | 2/1988 | EerNisse et al. | 310/328 |
| 4,785,215 A | | 11/1988 | Blech | 310/329 |
| 4,873,465 A | * | 10/1989 | Bourgeois | 310/361 |
| 5,156,460 A | | 10/1992 | Norling et al. | 374/117 |

FOREIGN PATENT DOCUMENTS

| | | |
|---|---|---|
| JP | 56065517 | 6/1981 |
| JP | 60-070808 | 4/1985 |
| JP | 11-023285 | 1/1999 |

* cited by examiner

*Primary Examiner*—Minh Nguyen
(74) *Attorney, Agent, or Firm*—Harness, Dickey & Pierce, P.L.C.

(57) ABSTRACT

A vibrating reed which includes a base; and a vibration arm section formed so as to protrude from this base wherein a through groove is formed in the vibration arm section, and a rigidity reinforcing section is provided in the through groove, and thus the frequency is not decreased and the CI value is not increased.

2 Claims, 15 Drawing Sheets

400
(MICROPHONE)
(SPEAKER)
CODING
PULSE-WIDTH MODULATION
LCD
KEYS
RAM
ROM
CONTROLLER
(32K TUNING-FORK OSCILLATOR)
MODULATOR/ DEMODULATOR
TEMPERATURE COMPENSATING CRYSTAL OSCILLATOR
TRANSMITTER
SYNTHESIZER FOR TRANSMITTER
SYNTHESIZER FOR RECEIVER
RECEIVER
ANTENNA SWITCH
RECEIVING FILTER AND AMPLIFIER
ANTENNA

VIBRATING REED, VIBRATOR, OSCILLATOR, AND ELECTRONIC DEVICE

FIELD OF THE INVENTION

The present invention relates to a vibrating reed formed of, for example, a crystal, a vibrator having the vibrating reed, an oscillator having the vibrator, and an electronic device having the vibrator.

DESCRIPTION OF THE RELATED ART

Conventionally, a tuning-fork-type crystal vibrating reed is constructed as shown in, for example, FIG. 17.

More specifically, a tuning-fork-type crystal vibrating reed 10 comprises a base 11, and two arm sections 12 and 13 formed so as to protrude from the base 11. In these two arm sections 12 and 13, through grooves 12*a* and 13*a* are formed.

More specifically, as shown in FIG. 18 which is an A–A' sectional view of FIG. 17, the arm sections 12 and 13 are formed with the through grooves 12*a* and 13*a*.

In such a tuning-fork-type crystal vibrating reed 10 having the through grooves 12*a* and 13*a* in the arm sections 12 and 13, as shown in FIG. 18, excitation electrodes 12*c* and 13*c* can be arranged in the inner sides of the through grooves 12*a* and 13*a*, respectively.

As a consequence, an electric field is effectively generated between excitation electrodes 12*d* and between excitation electrodes 13*d* arranged on the outer sides of the arm sections 12 and 13, respectively, and thus the arm sections 12 and 13 can be vibrated efficiently. Therefore, the vibrating reed becomes a tuning-fork-type crystal vibrating reed 10 having a small vibration loss.

However, when a voltage is applied to such a tuning-fork-type crystal vibrating reed 10 having the through grooves 12*a* and 13*a* in order to vibrate the arm sections 12 and 13, since the through grooves 12*a* and 13*a* are formed in the arm sections 12 and 13, the rigidity of the entire arm sections 12 and 13 is insufficient, and a problem arises in that the CI value (crystal impedance or equivalent series resistance) increases.

Furthermore, the vibrations of the arm sections 12 and 13 are performed as shown in FIG. 19. Only both end portions of the through grooves 12*a* and 13*a* vibrate, and the bending motion of the entire arm sections 12 and 13 will not likely occur.

The vibration is produced in the vicinity of, for example, 16 kHz on both end portions of such through grooves 12*a* and 13*a,* and another problem arises in that the frequency is considerably decreased in comparison with 32.768 kHz required by the tuning-fork-type crystal vibrating reed 10.

SUMMARY OF THE INVENTION

An object of the present invention is to provide a vibrating reed in which, even if through grooves are provided in vibration arm sections, the frequency is not decreased, and the CI value is not increased, a vibrator having the vibrating reed, an oscillator comprising the vibrator, and an electronic device comprising the vibrator.

According to the present invention, preferably, vibrating reeds from (1) to (10) below are provided.

(1) A vibrating reed comprising: a base; and a vibration arm section formed so as to protrude from this base, wherein a through groove is formed in the vibration arm section, and a rigidity reinforcing section is provided in the through groove.

(2) A vibrating reed, wherein the rigidity reinforcing section is a coupling section formed so as to span the through groove.

(3) A vibrating reed, wherein the through groove has a longer side and a shorter side, and the coupling section is a side bar which is coupled so as to span the longer side.

(4) A vibrating reed, wherein the length of the side bar along the thickness direction is substantially the same as the length of the through groove along the depth direction.

(5) A vibrating reed, wherein the length of the side bar along the thickness direction is shorter than the length of the through groove along the depth direction.

(6) A vibrating reed, wherein the side bar is formed shorter than the length of the through groove along the depth direction by half etching.

(7) A vibrating reed, wherein a plurality of the side bars are arranged.

(8) A vibrating reed, wherein a cut section is formed in the base.

(9) A vibrating reed, wherein the base is provided with a fixation area for fixing the vibrating reed, and the cut section is provided in the base between the fixation area and the vibration arm section.

(10) A vibrating reed, wherein the vibrating reed is a tuning-fork vibrating reed formed of a crystal which oscillates at nearly 32 kHz.

BRIEF DESCRIPTION OF THE DRAWINGS

FIG. 7(*b*) is a schematic perspective view showing another step of manufacturing the tuning-fork-type crystal vibrating reed of FIG. 1.

FIG. 10(*b*) is a schematic partial perspective view showing another modification of the tuning-fork-type crystal vibrating reed of FIG. 1.

FIG. 12(*b*) is a schematic perspective view showing another step of manufacturing the tuning-fork-type crystal vibrating reed of FIG. 9.

DESCRIPTION OF THE EMBODIMENTS

Regarding each aspect of the invention of the above-described (1) to (10), preferably, the following embodiments are provided. However, the present invention is not limited to these embodiments.

(11) A vibrator having a vibrating reed housed in a package, the vibrating reed comprising: a base; and a vibration arm section formed so as to protrude from this base, wherein a through groove is formed in the vibration arm section of the vibrating reed, and a rigidity reinforcing section is provided in the through groove.

(12) A vibrator, wherein the package is formed in a box shape.

(13) A vibrator, wherein the package is formed in a commonly-called cylinder type.

(14) An oscillator having a vibrating reed and an integrated circuit housed in a package, the vibrating reed comprising: a base; and a vibration arm section formed so as to protrude from this base, wherein a through groove is formed in the vibration arm section of the vibrating reed, and a rigidity reinforcing section is formed in the through groove.

(15) An electronic device using a vibrator which is connected to a control section, the vibrator having a vibrating reed housed in a package, the vibrating reed comprising: a base; and a vibration arm section formed so as to protrude from this base, wherein a through groove is formed in the vibration arm section of the vibrating reed, and a rigidity reinforcing section is formed in the through groove. The preferred embodiments of the present invention will be described below in detail with reference to the attached drawings.

Since the embodiments to be described below are preferred specific examples of the present invention, various preferable technical limitations are imposed thereon. However, the scope of the present invention is not limited to these embodiments.

Figure 1:
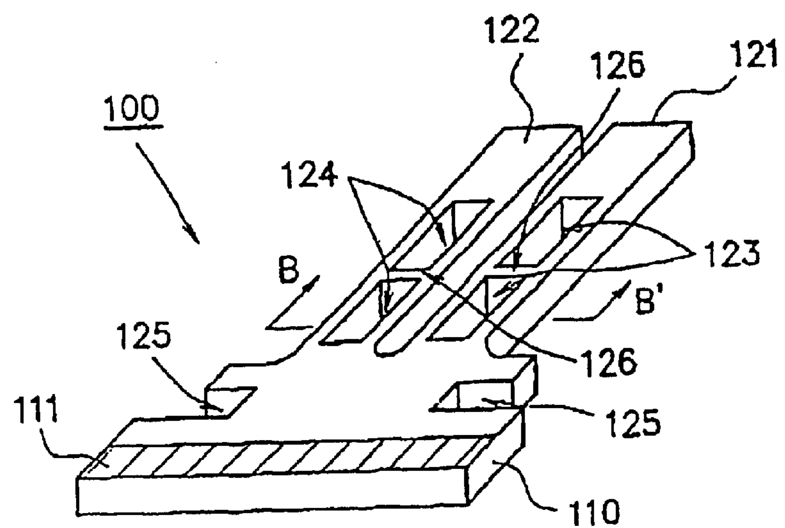
FIG. 1 is a schematic view of a tuning-fork-type crystal vibrating reed according to a first embodiment of the present invention.

FIG. 1 shows a tuning-fork-type crystal vibrating reed 100, which is a vibrating reed according to a first embodiment of the present invention.

The tuning-fork-type crystal vibrating reed 100 is formed in such a manner that a single quartz crystal is cut out so as to be formed as, for example, a commonly-called Z-plate crystal. Furthermore, since the tuning-fork-type crystal vibrating reed 100 shown in FIG. 1 is a vibrating reed which generates a signal at, for example, 32.768 kHz, it becomes a very small vibrating reed.

Such a tuning-fork-type crystal vibrating reed 100, as shown in FIG. 1, has a base 110. Two tuning-fork arms 121 and 122, which are vibration arm sections, are arranged in such a manner as to protrude upward in the figure from the base 110.

Furthermore, the tuning-fork arms 121 and 122 are formed with through grooves 123 and 124, respectively, as shown in FIG. 1.

Figure 2:
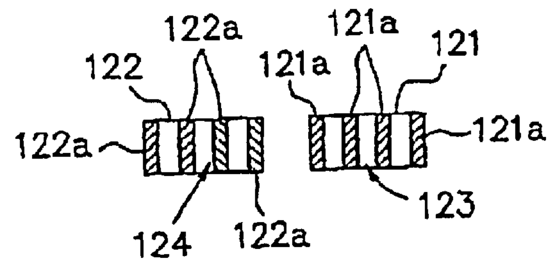
FIG. 2 is a sectional view along the line B–B' in FIG. 1.

FIG. 2 is a sectional view along the line B–B' in FIG. 1. As shown in FIG. 2, the through grooves 123 and 124 are formed.

As shown in FIG. 1, the entire base 110 of the tuning-fork-type crystal vibrating reed 100 is formed in nearly a plate shape.

In this base 110, as shown in FIG. 1, two cut sections 125 are provided on both sides of the base 110.

Since the cut sections 125 and 125 are positioned below the lower end portions of the through grooves 123 and 124 of the tuning-fork arms 121 and 122 as shown in FIG. 1, the presence of the cut section 125 does not hinder the vibration of the tuning-fork arms 121 and 122.

Furthermore, the portion indicated with oblique lines in FIG. 1 is a fixation area 111 which is actually fixed when the tuning-fork-type crystal vibrating reed 100 is fixed in a package.

As shown in FIG. 1, since the lower end portion of the cut section 125 is positioned higher than the fixation area 111 in FIG. 1, the cut section 125 does not exert an influence on the fixation area 111, and thus no adverse influence is exerted on the fixed state of the tuning-fork-type crystal vibrating reed 100 with respect to the package.

As described above, the cut sections 125 provided in the base 110 are provided at positions where no adverse influence is exerted on the vibration of the tuning-fork arms 121 and 122 of the tuning-fork-type crystal vibrating reed 100. Furthermore, the cut sections 125 are also provided at positions where no adverse influence is exerted on the fixed state of the tuning-fork-type crystal vibrating reed 100 with respect to the package.

Since the cut sections 125 are provided in the base 110 below the positions of the groove sections 123 and 124 of the tuning-fork arms 121 and 122, the cut section 125 makes it difficult for leakage vibration leaking from the groove sections 123 and 124 due to the vibration of the tuning-fork arms 121 and 122 to propagate to the fixation area 111 of the base 110.

Therefore, the leakage vibration propagates to the fixation area 111, and energy escape will not likely occur. For the conventional variation of the CI value between vibrating reed elements, the standard deviation is 10 KΩ or more. However, this causes the standard deviation to be greatly reduced to 1 KΩ.

The tuning-fork arms 121 and 122 of the tuning-fork-type crystal vibrating reed 100 shown in FIG. 1 are formed with the through grooves 123 and 124, as shown in FIG. 1. Therefore, as shown in FIG. 2, excitation electrodes 121*a* and 122*a* for vibrating the through grooves 123 and 124 can be arranged.

More specifically, since the excitation electrodes 121*a* and 122*a* can be arranged not only on the outer sides of the tuning-fork arms 123 and 124, but also on the sides of the through grooves 123 and 124, an electric field is efficiently distributed in the portions of the tuning-fork arms 123 and 124 sandwiched between the excitation electrodes 121*a* and 122*a,* respectively, and thus vibration is generated effectively.

Therefore, the tuning-fork-type crystal vibrating reed 100 having the through grooves 123 and 124 in this manner becomes a high-precision vibrating reed in which a vibration loss is small.

As described above, the tuning-fork-type crystal vibrating reed 100 having the through grooves 123 and 124 is a high-precision vibrating reed in which a vibration loss is small, however, since the through grooves 123 and 124 are formed in the tuning-fork arms 121 and 122, the portions of the tuning-fork arms 121 and 122 where the through grooves 123 and 124 are formed necessarily have insufficient rigidity.

Figure 19:
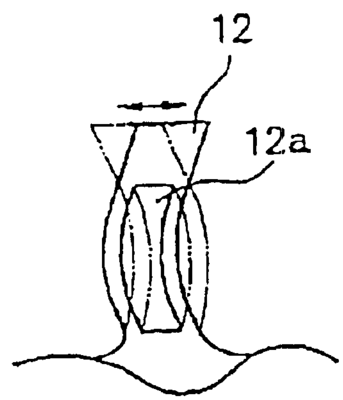
FIG. 19 is an illustration of the vibration of an arm section of FIG. 17.

This insufficient rigidity causes the CI value to be increased in the manner described above. Furthermore, as shown in FIG. 19, if the frequency of the vibrating reed is decreased to such a degree of about 16 kHz, 32.768 kHz which is the original frequency of the tuning-fork-type crystal vibrating reed 100 shown in FIG. 1 is unlikely to be generated, causing the vibrating reed to malfunction.

Accordingly, in this embodiment, as shown in FIG. 1, side bars 126 and 126, which are rigidity reinforcing sections, are arranged in the through grooves 123 and 124 formed in the tuning-fork arms 121 and 122 in such a manner as to span the longer sides of the through grooves 123 and 124. The side bars 126 and 126 are arranged substantially parallel to the shorter sides of the through grooves 123 and 124.

Furthermore, as shown in FIG. 1, the side bars 126 and 126 are arranged in substantially the central portion on the longer sides of the through grooves 123 and 124, in such a manner as to divide the through grooves 123 and 124 into two.

Therefore, as a result of the side bar 126 being arranged in the through grooves 123 and 124, the rigidity of the tuning-fork arms 121 and 122 on both sides of the above-described through grooves 123 and 124 having insufficient rigidity is compensated for, and the CI value is decreased.

Figure 3:
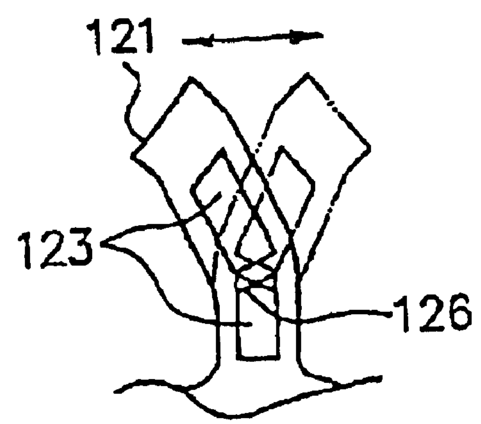
FIG. 3 is a schematic illustration showing the vibration state of the tuning-fork-type crystal vibrating reed of FIG. 1.

Furthermore, as a result of the side bar 126 being provided, the stress of the vibration of the tuning-fork arms 121 and 122 propagates through the side bar 126. Then, as shown in FIG. 3, the bending motion of the entire tuning-fork arms 121 and 122 becomes likely to occur. Furthermore, since this bending motion becomes likely to occur, the frequency is not decreased, and, for example, in the case of the tuning-fork-type crystal vibrating reed 100, this oscillates at 32.768 kHz, and the CI value is also decreased.

A description is specifically given below of the relationship between the frequency and the CI value for a case in which side bars are provided in the through grooves 123 and 124 and for a case in which side bars are not provided.

Figure 4:
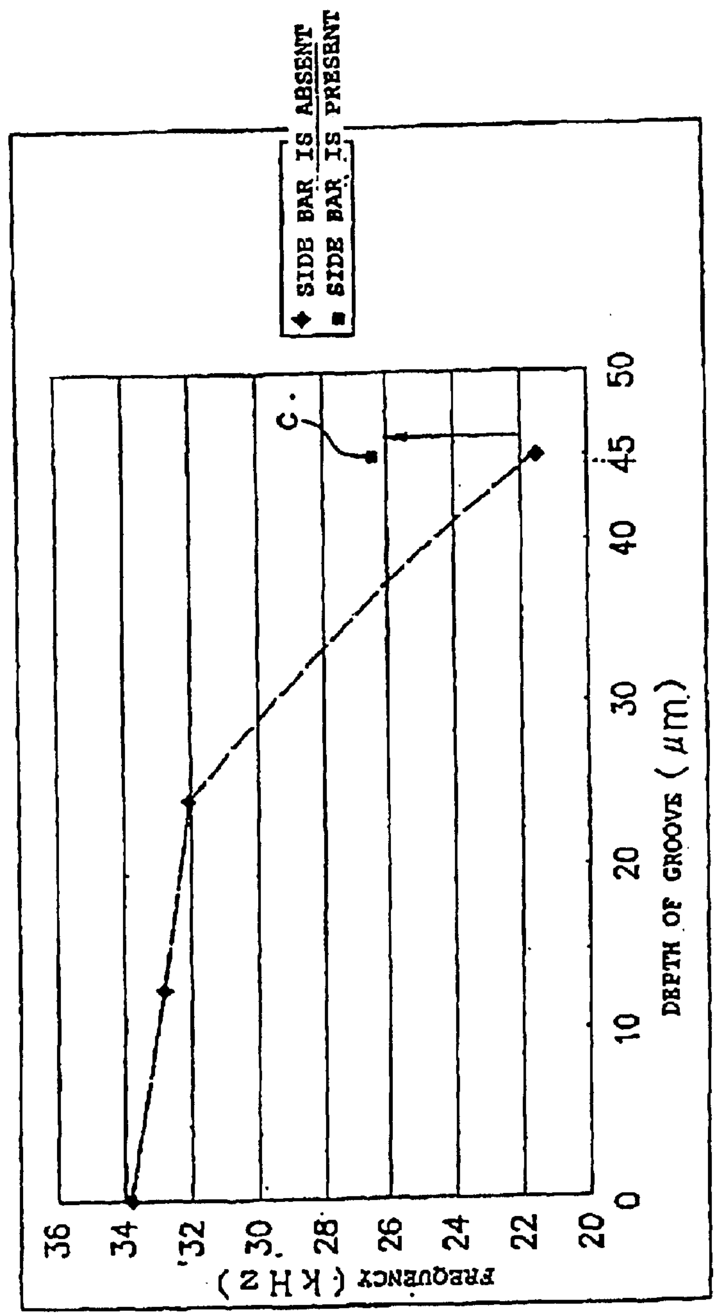
FIG. 4 shows the relationship between the depth of a groove and the frequency.

FIG. 4 shows the relationship between the depth of a groove formed in the tuning-fork arms 121 and 122 and the frequency. In FIG. 4, the broken line indicates the progression of the frequency when the depth of a groove is made deeper in a state in which no side bars are formed. The groove depth 45 μm shows that the groove goes through.

As shown in the figure, when no side bar is formed there is a tendency for the frequency to be decreased as the groove depth becomes deeper. It can be seen that, in particular, at the depth 45 μm at which the groove goes through, the frequency is sharply decreased.

Furthermore, the point indicated by C in the figure shows that the side bar is arranged in a state in which this groove goes through.

It can be seen that, as a result of arranging the side bar as shown in the figure, the frequency is increased from 22 kHz or lower to 26 kHz or higher. This side bar is arranged at a thickness of 5 μm with respect to the thickness 90 μm of the tuning-fork arms 121 and 122.

Therefore, if the thickness of this side bar is made the same as that of the tuning-fork arms 121 and 122 as shown in FIG. 1, the frequency is increased further to approach 32.768 kHz which is the oscillation frequency of the tuning-fork-type crystal vibrating reed 100 shown in FIG. 1.

Figure 5:
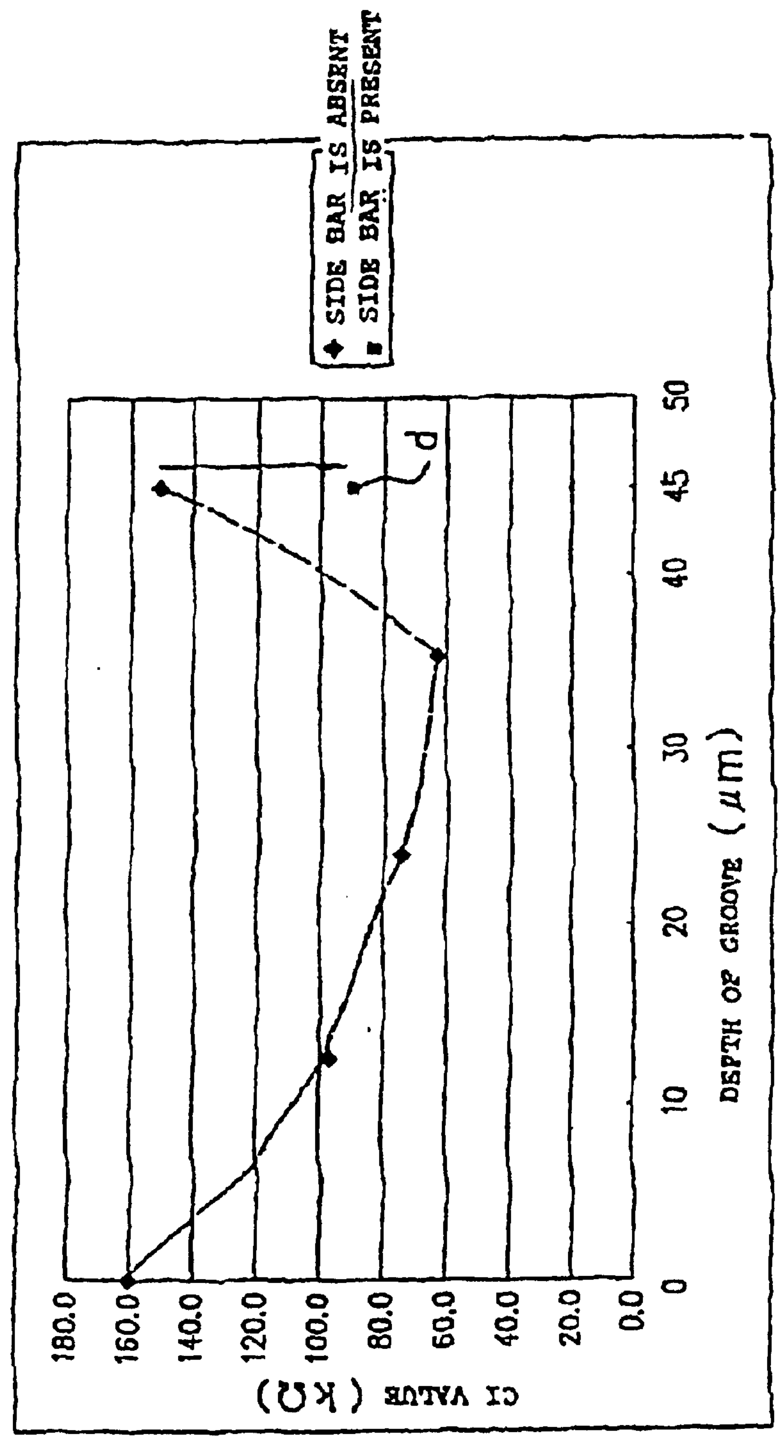
FIG. 5 shows the relationship between the depth of a groove and the CI value.

FIG. 5 shows the relationship between the depth of a groove formed in the tuning-fork arms 121 and 122 and the CI value. In FIG. 5, the broken line indicates the progression of the frequency when the depth of a groove is made deeper in a state in which no side bar is formed. The groove depth of 45 μm shows that the groove goes through.

As shown in the figure, when no side bar is formed there is a tendency for the CI value to be decreased as the groove depth becomes deeper. It can be seen that, in particular, at the depth 45 μm at which the groove goes through, the CI value is sharply increased.

Furthermore, the point indicated by d in the figure shows that the side bar is arranged in a state in which this groove goes through.

It can be seen that, as a result of arranging the side bar as shown in the figure, the CI value is decreased from 140.0 kΩ or more to 100 kΩ or less which is in a normal permissible range.

Similarly to that in FIG. 4, this side bar is also arranged at a thickness of 5 μm with respect to the thickness 90 μm of the tuning-fork arms 121 and 122.

Therefore, if the thickness of this side bar is made the same as that of the tuning-fork arms 121 and 122 as shown in FIG. 1, the CI value is decreased further, and thus a tuning-fork-type crystal vibrating reed 100 having a higher precision is formed.

The tuning-fork-type crystal vibrating reed 100 of this embodiment is constructed as described above. A method of manufacturing it will be described below.

Figure 6:
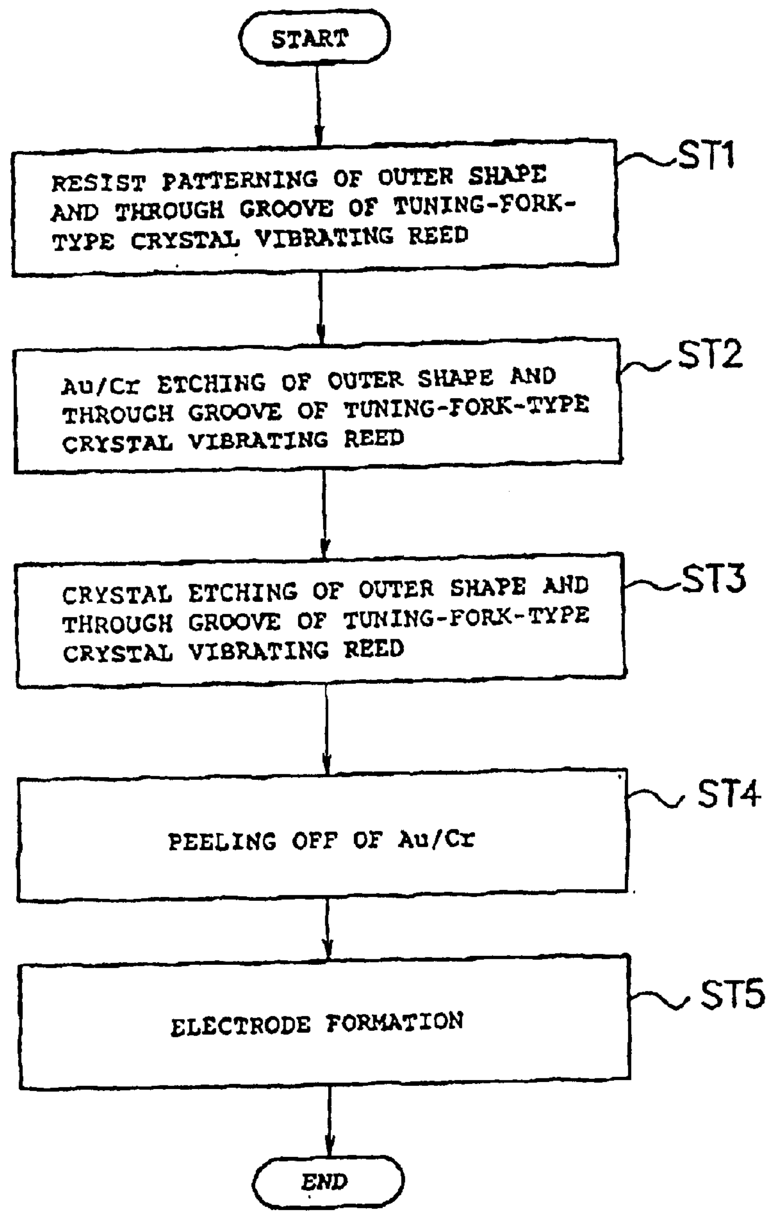
FIG. 6 is a flowchart showing the steps of manufacturing the tuning-fork-type crystal vibrating reed of FIG. 1.

FIG. 6 is a flowchart showing feature portions of the steps of manufacturing the tuning-fork-type crystal vibrating reed 100 shown in FIG. 1.

Figure 7A:
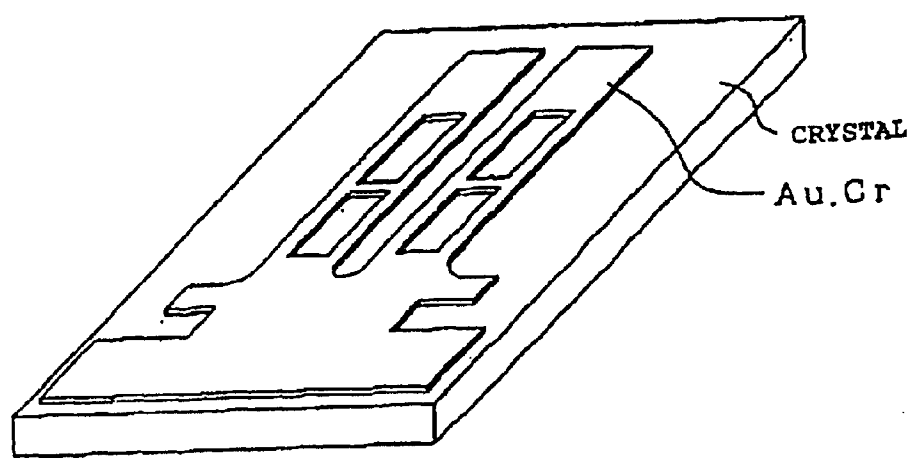
FIG. 7(*a*) is a schematic perspective view showing a step of manufacturing the tuning-fork-type crystal vibrating reed of FIG. 1.
Figure 7B:
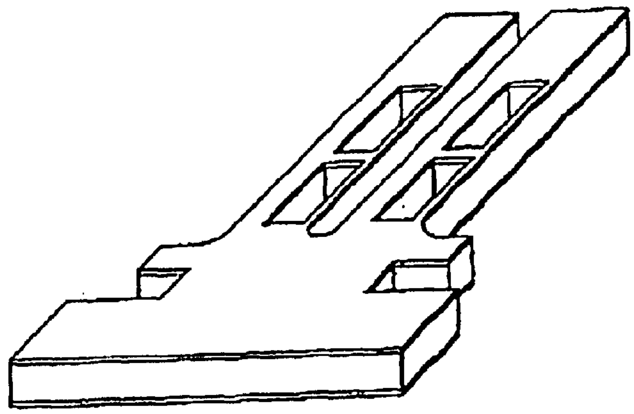

More specifically, initially, as shown in ST1, resist patterning of the outer shape and the through groove of the tuning-fork-type crystal vibrating reed is performed. Thereafter, as shown in ST2, Au/Cr etching of the portion formed as the outer shape and the through groove of the tuning-fork-type crystal vibrating reed is performed. FIG. 7(*a*) shows this state.

Thereafter, etching of the outer shape and the crystal portion of the through groove of the tuning-fork-type crystal vibrating reed is performed as shown in ST3 of FIG. 6. FIG. 7(*b*) shows this state.

Figure 8:
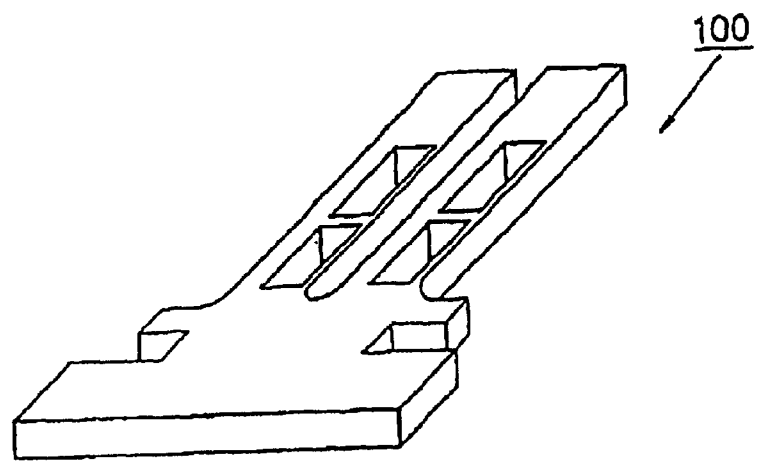
FIG. 8 is a schematic perspective view showing another step of manufacturing the tuning-fork-type crystal vibrating reed of FIG. 1.

Thereafter, Au/Cr is peeled off as shown in ST4. FIG. 8 shows this state, and then the tuning-fork-type crystal vibrating reed 100 shown in FIG. 1 is formed. Then, thereafter, as a result of an electrode being formed as shown in ST5, the tuning-fork-type crystal vibrating reed 100 having the electrode is manufactured.

In the manner described above, steps similar to the conventional photolithographic steps make it possible to easily form the side bar 126 in the through grooves 123 and 124 of the tuning-fork arms 121 and 122.

Figure 9:
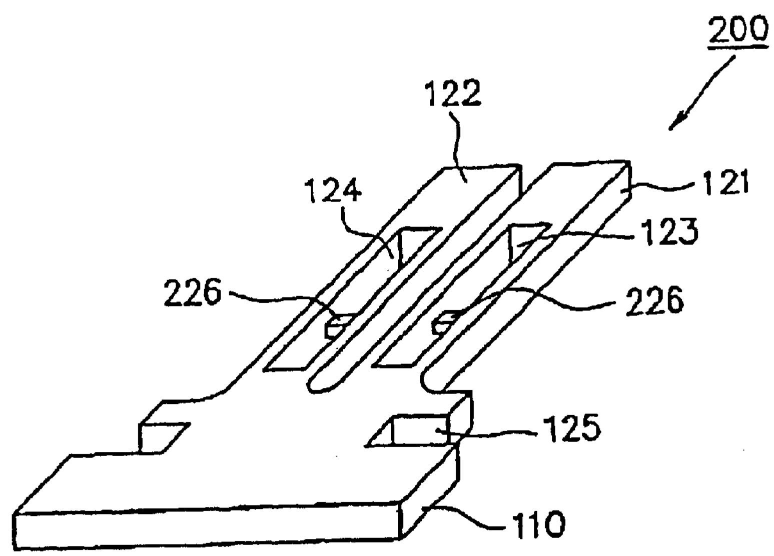
FIG. 9 is a schematic perspective view showing a tuning-fork-type crystal vibrating reed according to a modification of the first embodiment.

FIG. 9 shows a tuning-fork-type crystal vibrating reed 200 according to a modification of the first embodiment. The tuning-fork-type crystal vibrating reed 200 according to this modification differs in only the construction of a side bar 226 from the tuning-fork-type crystal vibrating reed 100 of FIG. 1. Accordingly, the same reference numerals are used for the construction similar to the tuning-fork-type crystal vibrating reed 100 of FIG. 1, and description thereof is omitted. Descriptions centering on differences will be described below.

The thickness of the side bar 226 of the tuning-fork-type crystal vibrating reed 200 of FIG. 9 is formed thinner than that of the tuning-fork arms 121 and 122. That is, the side bar 226 is formed only in the central portion which does not reach the upper end portion and the lower end portion of the through grooves 123 and 124 along the depth direction.

Figure 10A:
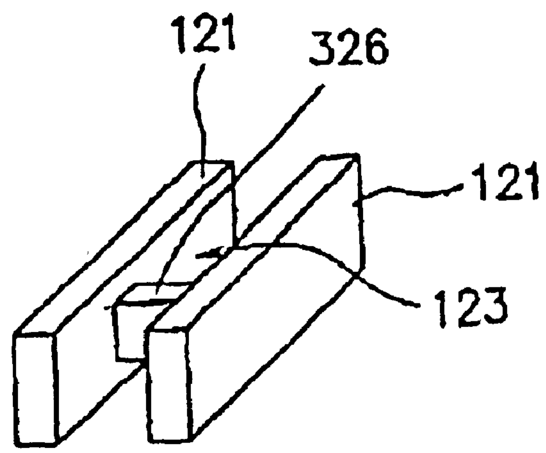
FIG. 10(*a*) is a schematic partial perspective view showing another modification of the tuning-fork-type crystal vibrating reed of FIG. 1.
Figure 10B:
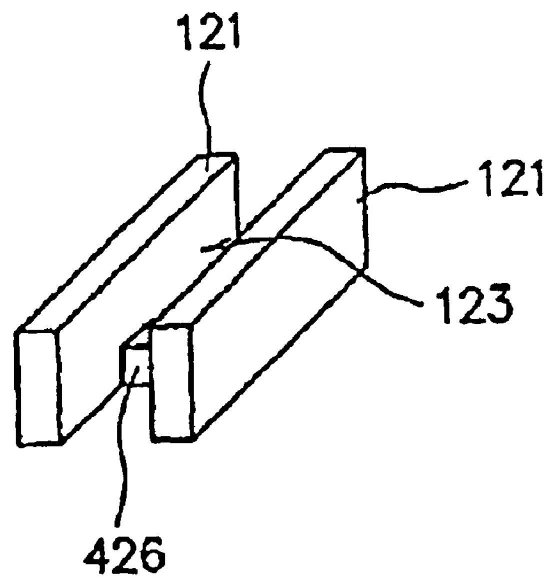

In addition to the side bar 226 shown in FIG. 9, side bars 326 and 426 may be formed, as shown in FIGS. 10(*a*) and 10(*b*). FIG. 10 includes schematic perspective views showing the side bars 326 and 426 and the vicinities thereof.

Figure 11:
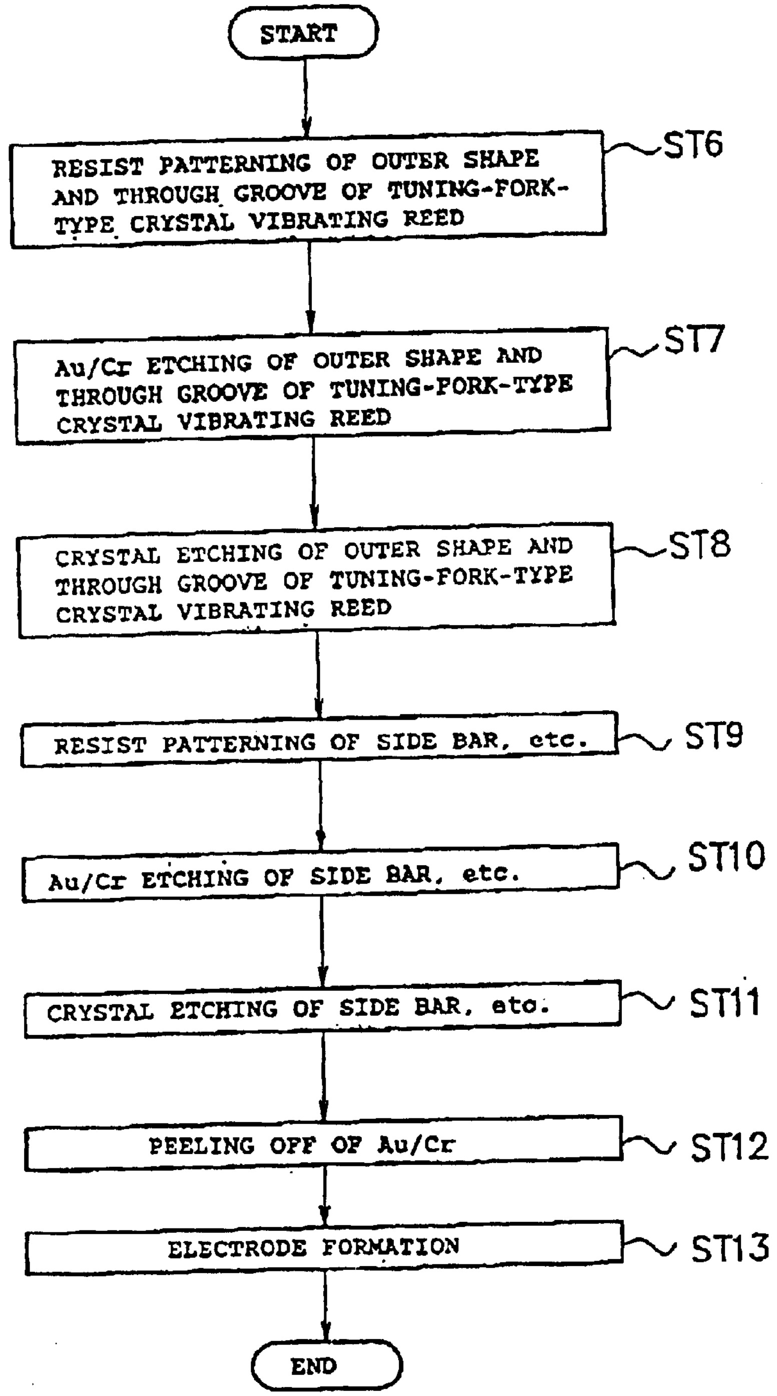
FIG. 11 is a flowchart showing the steps of manufacturing the tuning-fork-type crystal vibrating reed of FIG. 9.

In the case of this modification, the vibrating reed is manufactured through half-etching steps such as those described below. FIG. 11 is a flowchart showing the features of steps of manufacturing the tuning-fork-type crystal vibrating reed 200 shown in FIGS. 9 and 10.

ST6 to ST8 in FIG. 11 are the same as ST1 to ST3 of FIG. 6 described above. Furthermore, ST12 and ST13 in FIG. 11 are the same as ST4 and ST5 in FIG. 6.

That is, the flowchart in FIG. 11 is the one that ST9 to ST11 are inserted between ST3 and ST4 of the flowchart in FIG. 6. Accordingly, ST9 to ST11 will be described below.

Figure 12A:
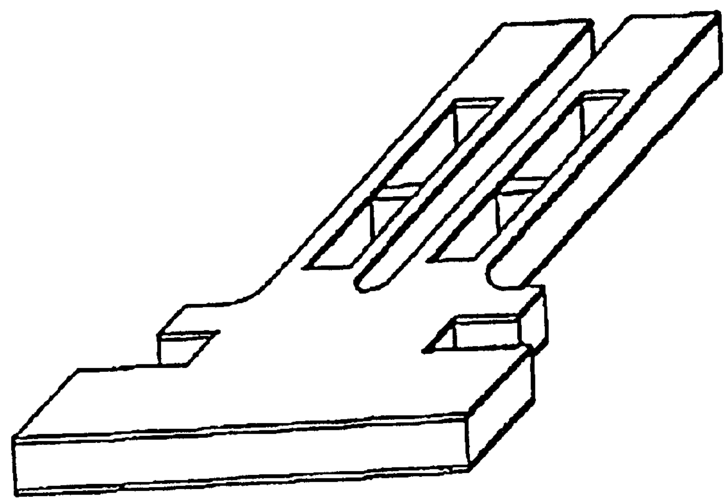
FIG. 12(*a*) is a schematic perspective view showing a step of manufacturing the tuning-fork-type crystal vibrating reed of FIG. 9.
Figure 12B:
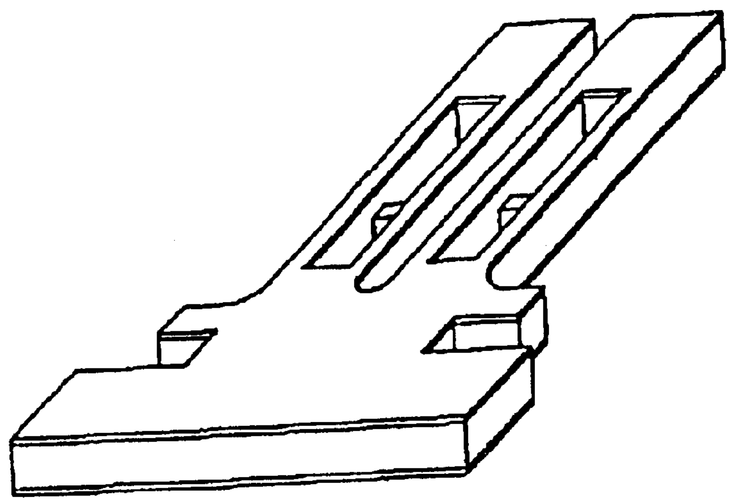

The steps ST9 to ST11 are the above-described half-etching steps for the side bar 226, etc. That is, resist patterning is performed on the side bar, etc. (ST9) and, thereafter, Au/Cr etching of the side bar, etc., is performed (ST10). FIG. 12(*a*) shows this state.

Thereafter, crystal etching of the side bar, etc., is performed (ST11). This crystal etching is performed in accordance with the depth of the side bar 226 shown in FIG. 9.

Therefore, when the shapes of the side bars 326 and 426 of FIG. 10(*a*) or FIG. 10(*b*) are to be formed, half-etching is performed so as to conform with those shapes.

Thereafter, similarly to FIG. 6, Au/Cr is peeled off (ST12, FIG. 11), and the tuning-fork-type crystal vibrating reed 200, etc., shown in FIG. 9, is manufactured. After undergoing an electrode formation step (ST13, FIG. 11), the tuning-fork-type crystal vibrating reed 200 having electrodes, etc., is manufactured.

Figure 13:
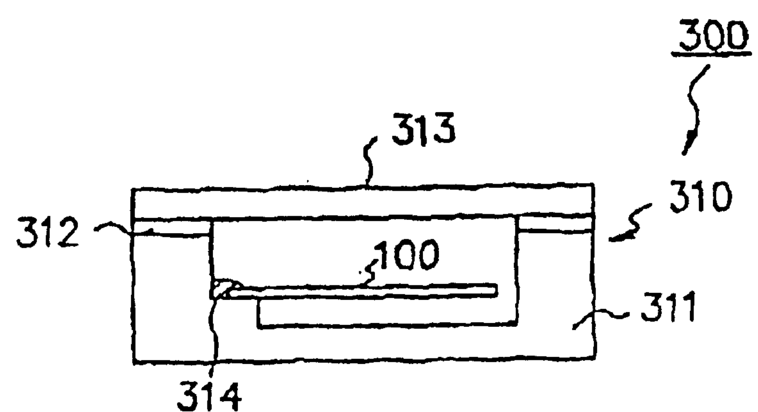
FIG. 13 is a schematic sectional view showing the construction of a ceramic-packaged tuning-fork-type vibrator according to a second embodiment of the present invention.

FIG. 13 shows a ceramic-packaged tuning-fork-type vibrator 300, which is a vibrator according to a second embodiment of the present invention.

This ceramic-packaged tuning-fork-type vibrator 300 uses the tuning-fork-type crystal vibrating reed 100 of the above-described first embodiment. Accordingly, the same reference numerals are used for the construction, the operation, etc., of the tuning-fork-type crystal vibrating reed 100, and description thereof is omitted.

FIG. 13 is a schematic sectional view showing the construction of the ceramic-packaged tuning-fork-type vibrator 300. As shown in FIG. 13, the ceramic-packaged tuning-fork-type vibrator 300 has a box-shaped package 310 having a space therein.

This package 310 comprises a base 311 on the bottom thereof. This base 311 is formed from, for example, ceramic such as alumina.

A sealing section 312 is provided on the base 311, with the sealing section 312 being formed from the same material as that of the base 311. Furthermore, a lid member 313 is placed on the upper end portion of this sealing section 312, and the base 311, the sealing section 312, and the lid member 313 form a hollow box.

An electrode 314 on the package side is provided on the base 311 of the package 310 formed in this manner. A fixation area 111 of the base 110 of the tuning-fork-type crystal vibrating reed 100 having an electrode formed therein is fixed onto the electrode 314 for the package side via a conductive bonding agent, etc.

Since this tuning-fork-type crystal vibrating reed 100 is formed as shown in FIG. 1, it becomes a high-precision vibrating reed in which the frequency is not decreased and the CI value is not increased.

Figure 14:
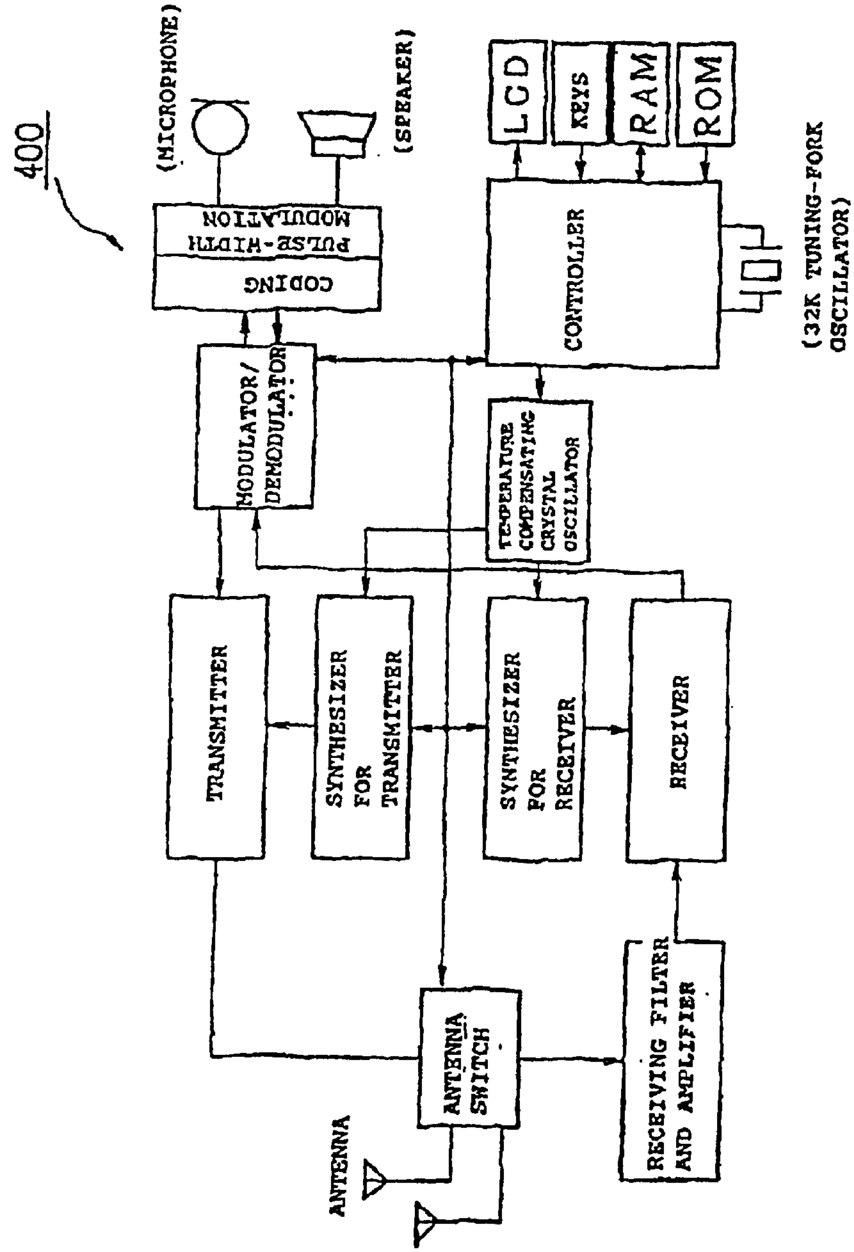
FIG. 14 is a schematic view showing the circuit blocks of a portable digital phone according to a third embodiment of the present invention.

FIG. 14 is a schematic view showing a portable digital phone 400 which is an electronic device according to a third embodiment of the present invention.

This portable digital phone 400 uses the ceramic-packaged tuning-fork-type vibrator 300 of the above-described second embodiment and the tuning-fork-type crystal vibrating reed 100.

Accordingly, the same reference numerals are used for the construction, the operation, etc., of the ceramic-packaged tuning-fork-type vibrator 300 and the tuning-fork-type crystal vibrating reed 100, and description thereof are omitted.

FIG. 14 shows the circuit blocks of the portable digital phone 400. As shown in FIG. 14, in a case where transmission is performed by the digital portable phone 400, when the user inputs his/her voice into a microphone, the signal passes through pulse-width modulation/coding blocks, modulator/demodulator blocks, a transmitter, and an antenna switch, and is transmitted from an antenna.

On the other hand, a signal transmitted from the telephone of another person is received by the antenna, passed through the antenna switch and the receiving filter, and input to the modulator/demodulator blocks from the receiver. Then, the modulated or demodulated signal passes through the pulse-width modulation/coding blocks and is output from the speaker as sound.

A controller for controlling the antenna switch, the modulator/demodulator blocks, etc., among the above is provided.

There is a demand for this controller to have a high precision because it controls, in addition to the above, an LCD which is a display section, keys which are a section for inputting numbers and others, a RAM, a ROM, etc.

As a vibrator meeting such a demand, the above-described ceramic-packaged tuning-fork-type vibrator 300 is used.

This ceramic-packaged tuning-fork-type vibrator 300 has the high-precision tuning-fork-type crystal vibrating reed 100 shown in FIG. 1, in which the frequency is not decreased and the CI value is not increased.

Therefore, the digital portable phone 400 incorporating this ceramic-packaged tuning-fork-type vibrator 300 also becomes a high-precision digital portable phone having a high-precision vibrating reed in which the frequency is not decreased and the CI value is not increased.

Figure 15:
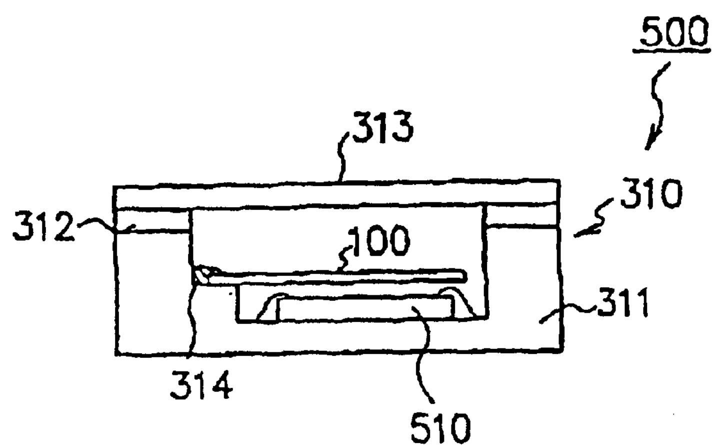
FIG. 15 is a schematic sectional view showing the construction of a digital tuning-fork crystal oscillator according to a fourth embodiment of the present invention.

FIG. 15 shows a digital tuning-fork crystal oscillator 500, which is an oscillator according to a fourth embodiment of the present invention.

The construction of this digital tuning-fork crystal oscillator 500 is similar in many portions to the ceramic-packaged tuning-fork-type vibrator 300 of the above-described second embodiment. Accordingly, the same reference numerals are used for the construction, the operation, etc., of the ceramic-packaged tuning-fork-type vibrator 300 and the tuning-fork-type crystal vibrating reed 100, and description thereof are omitted.

The digital tuning-fork crystal oscillator 500 shown in FIG. 15 is formed in such a manner that an integrated circuit 510 is arranged, as shown in FIG. 15, below the tuning-fork-type crystal vibrating reed 100 of the ceramic-packaged tuning-fork vibrator 300 shown in FIG. 13 and on the base 311.

More specifically, in the digital tuning-fork crystal oscillator 500, when the tuning-fork-type crystal vibrating reed 100 arranged therein vibrates, the vibration is input to the integrated circuit 510 and, thereafter, as a result of extracting a predetermined frequency signal, the digital tuning-fork crystal oscillator 500 functions as an oscillator.

That is, since the tuning-fork-type crystal vibrating reed 100 housed in the digital tuning-fork crystal oscillator 500 is formed as shown in FIG. 1, it becomes a high-precision oscillator having a vibrating reed in which the frequency is not decreased and the CI value is not increased.

Figure 16:
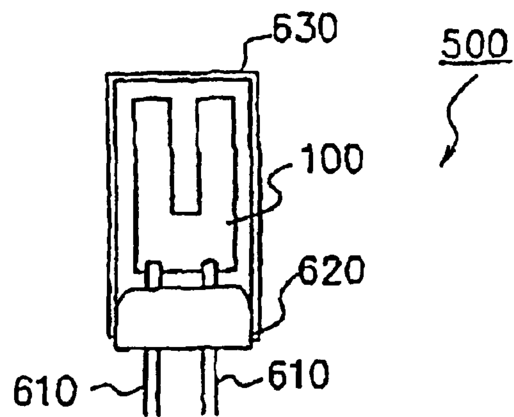
FIG. 16 is a schematic sectional view showing the construction of a cylinder-type tuning-fork vibrator according to a fifth embodiment of the present invention.
Figure 17:
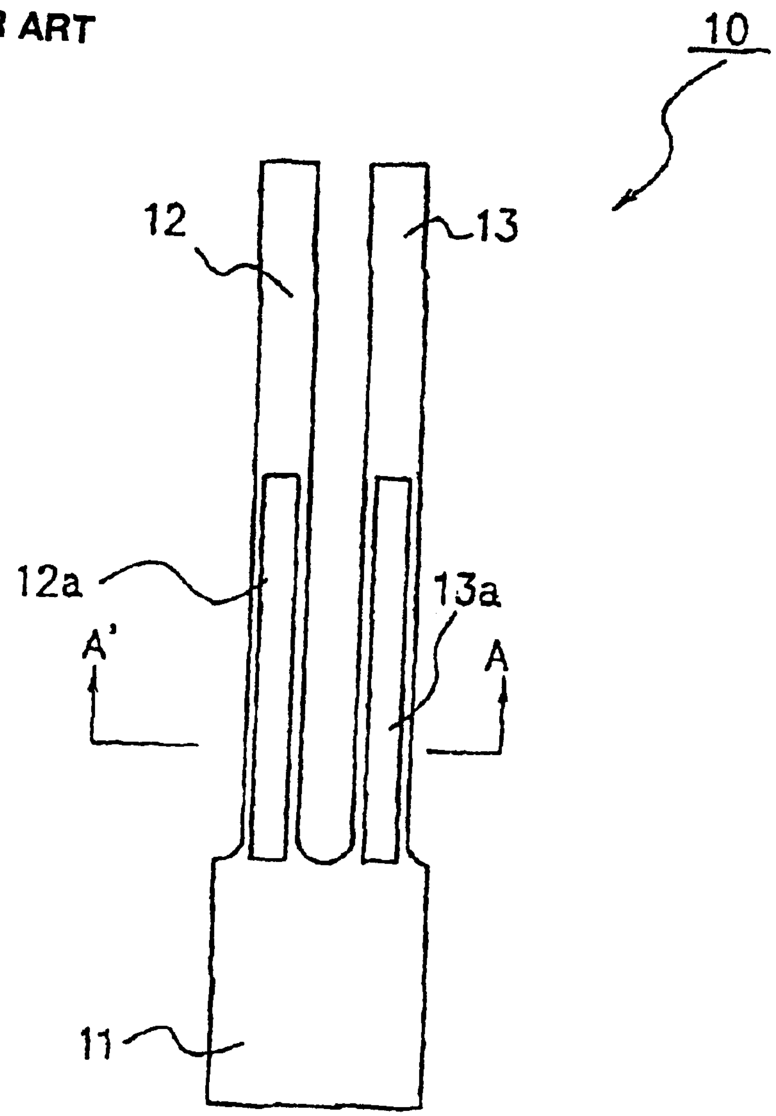
FIG. 17 is a schematic view showing a conventional tuning-fork-type crystal vibrating reed.
Figure 18:
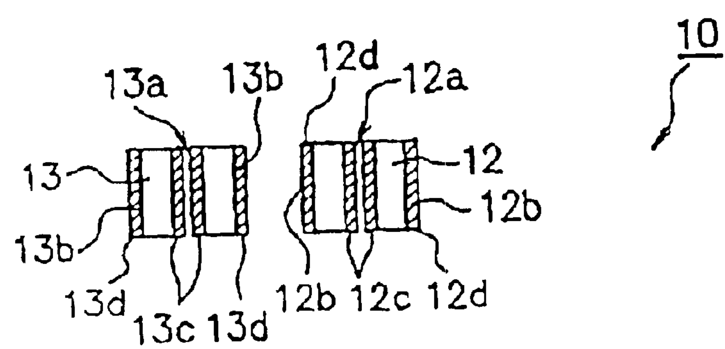
FIG. 18 is a schematic sectional view along the line A–A' in FIG. 17.

FIG. 16 shows a cylinder-type tuning-fork vibrator 600, which is a vibrator according to a fifth embodiment of the present invention.

This cylinder-type tuning-fork vibrator 600 uses the tuning-fork-type crystal vibrating reed 100 according to the above-described first embodiment. Accordingly, the same reference numerals are used for the construction, the operation, etc., of the tuning-fork-type crystal vibrating reed 100, and description thereof are omitted.

FIG. 16 is a schematic view showing the construction of a cylinder-type tuning-fork vibrator 600.

As shown in FIG. 16, the cylinder-type tuning-fork vibrator 600 has a metal cap 630 for housing the tuning-fork-type crystal vibrating reed 100 therein. This cap 630 is press-fitted into a stem 620 so that the inside thereof is maintained in a vacuum state.

Furthermore, two leads 610 for holding the tuning-fork-type crystal vibrating reed 100 housed in the cap 630 are arranged.

When an electric current is externally applied to such a cylinder-type tuning-fork vibrator 600, the tuning-fork arms 121 and 122 of the tuning-fork-type crystal vibrating reed 100 vibrate, and it functions as a vibrator.

At this time, since the tuning-fork-type crystal vibrating reed 100 is formed as shown in FIG. 1, it becomes a high-precision vibrating reed in which the frequency is not decreased and the CI value is not increased. Therefore, the cylinder-type tuning-fork vibrator 600 incorporating this vibrating reed also becomes a small high-performance vibrator.

Although in each of the above-described embodiments and the modification, a description is given of a case where one side bar 126 is arranged in each of the through grooves 123 and 124, in addition, a plurality of side bars 126 may be arranged in each of the through grooves 123 and 124.

Furthermore, although in each of the above-described embodiments, a description is given by using a tuning-fork-type crystal vibrating reed of 32.738 kHz as an example, it is clear that the invention can be also embodied as a tuning-fork-type crystal vibrating reed of 15 to 155 kHz.

It is clear that the tuning-fork-type crystal vibrating reed 100 according to the above-described embodiments can be used for not only the above-described examples, but also for other electronic devices, mobile information terminals, built-in-clock devices such as televisions, video devices, radio cassette recorders, or personal computers, and clocks.

In addition, the present invention is not limited to the above-described embodiments, and various modifications are possible within the scope of the claims. A part of the construction of the above-described embodiments can be omitted, or can be changed to a desired combination which is not described in the foregoing.

As has thus been described, according to the present invention, it is possible to provide a vibrating reed in which, even if through grooves are provided in vibration arm sections, the frequency is not decreased and the CI value is not increased, a vibrator having the vibrating reed, an oscillator comprising the vibrator, and an electronic device comprising the vibrator.

The entire disclosure of Japanese Patent Application No. 2001-059046 filed Mar. 2, 2001 is incorporated by reference herein.

What is claimed is:

1. An oscillator having a vibrating reed and an integrated circuit housed in a package, said vibrating reed comprising:

a mounting base for mounting the vibrating read to an object;

an elongated vibration arm formed so as to protrude from a fixed end at the base to a free end spaced apart from the base;

at least one through groove formed on said vibration arm; and a rigidity reinforcing section spanning the through groove.

2. An electronic device using a vibrator which is connected to a control section, said vibrator having a vibrating reed housed in a package, said vibrating reed comprising:

a mounting base for mounting the vibrating reed to an object;

an elongated vibration arm formed so as to protrude from a fixed end at the base to a free end spaced apart from the base;

at least one through groove formed on said vibration arm; and a rigidity reinforcing section spanning the through groove.

* * * * *